United States Patent
Hanafi et al.

(10) Patent No.: US 7,271,453 B2
(45) Date of Patent: Sep. 18, 2007

(54) BURIED BIASING WELLS IN FETS

(75) Inventors: Hussein I. Hanafi, Basking Ridge, NJ (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 10/711,450

(22) Filed: Sep. 20, 2004

(65) Prior Publication Data

US 2006/0060918 A1 Mar. 23, 2006

(51) Int. Cl.
*H01L 29/76* (2006.01)

(52) U.S. Cl. .................. 257/372; 257/394

(58) Field of Classification Search ........ 257/372–374, 257/394–397, 386, E29.267, E29.021, E21.431, 257/E21.339; 438/300
See application file for complete search history.

(56) References Cited

U.S. PATENT DOCUMENTS

| | | | |
|---|---|---|---|
| 4,824,796 A | 4/1989 | Chiu et al. | |
| 4,862,232 A * | 8/1989 | Lee | 257/382 |
| 4,885,618 A | 12/1989 | Schubert et al. | |
| 5,290,714 A | 3/1994 | Onozawa | |
| 5,362,663 A | 11/1994 | Bronner et al. | |
| 5,548,143 A | 8/1996 | Lee | |
| 5,789,286 A | 8/1998 | Subbanna | |
| 5,932,908 A | 8/1999 | Noble | |
| 6,001,676 A | 12/1999 | Sawada et al. | |
| 6,074,899 A | 6/2000 | Voldman | |
| 6,469,355 B1 | 10/2002 | Schneider et al. | |
| 6,674,672 B2 | 1/2004 | Forbes et al. | |
| 2004/0046208 A1 | 3/2004 | Dennard et al. | |

* cited by examiner

*Primary Examiner*—David Vu
(74) *Attorney, Agent, or Firm*—Schmeiser, Olsen & Watts; William D. Sabo

(57) ABSTRACT

A structure of a semiconductor device and method for fabricating the same is disclosed. The semiconductor structure comprises first and second source/drain regions; a channel region disposed between the first and second source/drain regions; a buried well region in physical contact with the channel region; and a buried barrier region being disposed between the buried well region and the first source/drain region and being disposed between the buried well region and the second source/drain region, wherein the buried barrier region is adapted for preventing current leakage and dopant diffusion between the buried well region and the first source/drain region and between the buried well region and the second source/drain region.

6 Claims, 5 Drawing Sheets

US 7,271,453 B2

BURIED BIASING WELLS IN FETS

BACKGROUND OF THE INVENTION

1. Technical Field

The present invention relates to doped wells, and more particularly, to doped biasing wells used to reduce threshold voltage variation in semiconductor integrated circuits.

2. Related Art

Fabricating a semiconductor device such that it has a target threshold voltage as designed is difficult. One of the methods for achieving the target threshold voltage as designed is to form a highly-doped well under the channel region of the semiconductor device and use well (voltage) bias as a means of adjusting the threshold voltage to the target. However, the highly-doped biasing well results in leakage current between itself and the source/drain regions of the semiconductor device as well as increased junction capacitance, particularly at the edge of the junctions beneath the channel.

Therefore, there is a need for a novel structure in the semiconductor device to eliminate or reduce such leakage current and such junction capacitance. There is also a need for a method for fabricating such a novel structure.

SUMMARY OF THE INVENTION

The present invention provides a semiconductor structure, comprising (a) first and second source/drain regions; (b) a channel region disposed between the first and second source/drain regions; (c) a buried well region in physical contact with the channel region; and (d) a buried barrier region being disposed between the buried well region and the first source/drain region and being disposed between the buried well region and the second source/drain region, wherein the buried barrier region is adapted for preventing leakage current between the buried well region and the first source/drain region and between the buried well region and the second source/drain region.

The present invention also provides a method for forming a semiconductor structure, the method comprising the steps of (a) providing a semiconductor substrate covered on top with a mandrel layer; (b) etching a trench through the mandrel layer and into the substrate; (c) forming a buried barrier region on a side wall of the trench, wherein the buried barrier region is in direct physical contact with both the substrate and the mandrel layer; (d) forming a buried well region and a channel region in the trench, wherein the channel region is on top of the buried well region; and (e) forming first and second source/drain regions, wherein the channel region is disposed between the first and second source/drain regions, and wherein the buried barrier region is disposed between the buried well region and the first source/drain region and is disposed between the buried well region and the second source/drain region.

The present invention also provides a method for forming a semiconductor structure, the method comprising the steps of (a) providing a semiconductor substrate covered on top with a mandrel layer; (b) etching a trench through the mandrel layer and into the substrate; (c) forming a buried barrier region on a side wall of the trench, wherein the buried barrier region is in direct physical contact with both the substrate and the mandrel layer; (d) depositing a semiconductor material in the trench so as to form an under-gate region such that the buried barrier region is completely buried in the under-gate region; (e) forming a gate spacer region on side walls of the trench; (f) doping via the trench a portion of the under-gate region which is surrounded by the buried barrier region, wherein the doped portion of the under-gate region comprises a buried well region, and wherein an undoped portion of the under-gate region on top of the buried well region comprises a channel region; (g) forming a gate dielectric layer on top of the channel region; (h) forming a gate region on top of the gate dielectric layer, wherein the gate region is electrically insulated from the channel region by the gate dielectric layer; and (i) forming first and second source/drain regions in the substrate, wherein the channel region is disposed between the first and second source/drain regions, wherein the buried barrier region is disposed between the buried well region and the first source/drain region and is disposed between the buried well region and the second source/drain region, and wherein the buried barrier region is adapted for preventing leakage current between the buried well region and the first source/drain region and between the buried well region and the second source/drain region.

The present invention also provides a method for forming a semiconductor structure, the method comprising the steps of (a) providing a silicon-on-insulator (SOI) substrate covered on top with a mandrel layer, wherein the SOI substrate includes (i) an upper semiconductor layer, (ii) a lower semiconductor layer, and (iii) an electrical insulator layer sandwiched between the upper and lower semiconductor layers; (b) etching a trench through the mandrel layer and into the SOI substrate such that the lower semiconductor layer is exposed to the atmosphere at a bottom wall of the trench; (c) forming a buried barrier region on a side wall of the trench, wherein the buried barrier region is in direct physical contact with both the SOI substrate and the mandrel layer; (d) forming a buried well region and a channel region in the trench, wherein the channel region is on top of the buried well region; and (e) forming first and second source/drain regions, wherein the channel region is disposed between the first and second source/drain regions, wherein the buried barrier region is disposed between the buried well region and the first source/drain region and is disposed between the buried well region and the second source/drain region.

The present invention provides a semiconductor structure with reduced leakage current and reduced capacitance between its doped biasing well and its source/drain regions.

Figure 1A:
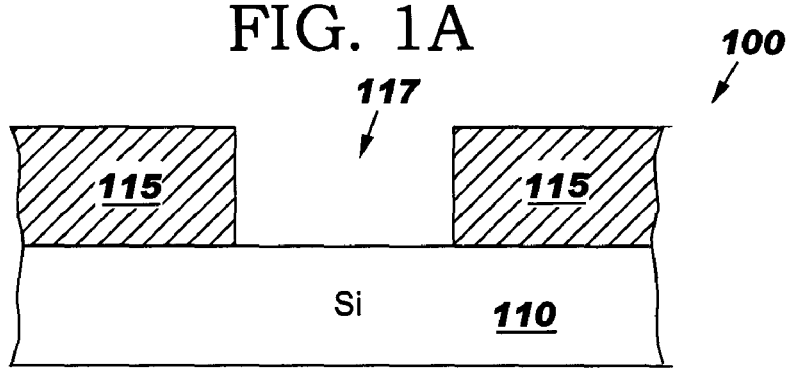
FIGS. 1A-1I illustrate cross sectional views of a semiconductor structure going through different fabrication steps, in accordance with embodiments of the present invention.
Figure 1B:
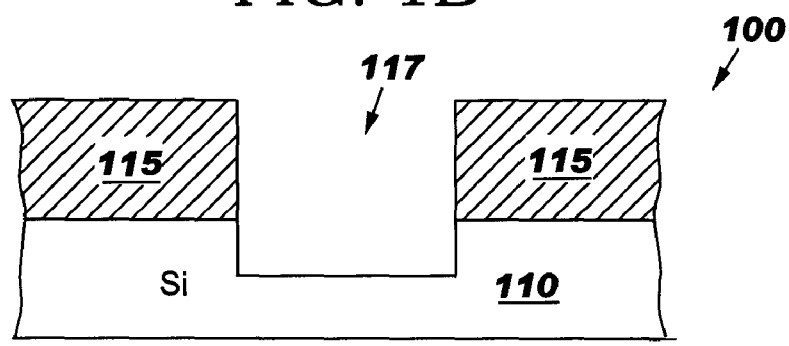

With reference to FIG. 1A, in one embodiment, the fabrication of a semiconductor structure 100 starts out with a single-crystal silicon substrate 110 covered on top with a mandrel layer 115. In one embodiment, the mandrel layer 115 can comprise a nitride such as silicon nitride ($Si_3N_4$). Then, a trench 117 is etched through the mandrel layer 115 so that the substrate 110 is exposed at the bottom of the trench 117. Next, in one embodiment, the trench 117 is etched deeper into the substrate 110 as shown in FIG. 1B.

Figure 1C:
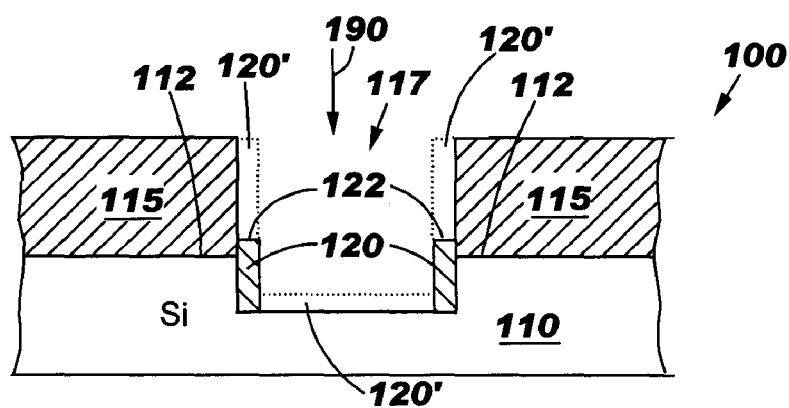

With reference to FIG. 1C, in one embodiment, a buried barrier region 120 is formed on side walls of the trench 117. In one embodiment, the buried barrier region 120 can comprise silicon dioxide ($SiO_2$). In one embodiment, the buried barrier region 120 can have the shape of a hollow pipe whose top view has the shape of a ring. In one embodiment, the top surface 122 of the buried barrier region 120 is higher than the top surface 112 of the substrate 110. In other words, the buried barrier region 120 is in direct physical contact with both the substrate 110 and the mandrel layer 115.

In one embodiment, the formation of the buried barrier region 120 can start with the formation of a buried barrier layer 120' (defined by dashed line) on side and bottom walls of the trench 117 by, illustratively, CVD $SiO_2$ (i.e., chemical vapor deposition of silicon dioxide). Then, the buried barrier layer 120' is etched down in vertical direction 190 (anisotropic etching). As a result, the buried barrier region 120 is formed as shown.

Figure 1D:
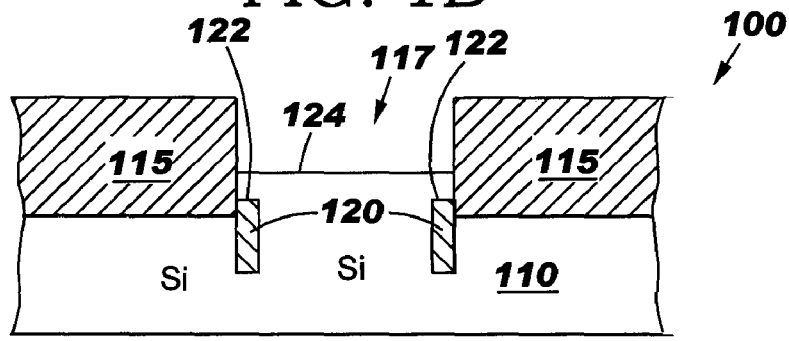

With reference to FIG. 1D, in one embodiment, silicon material is epitaxially grown in the trench 117 to a top surface 124 which is higher than the top surface 122 of the buried barrier region 120. As a result, the substrate 110 has a new top surface 124 in the trench 117, and the buried barrier region 120 is completely submerged (i.e., buried) in the substrate 110.

Figure 1E:
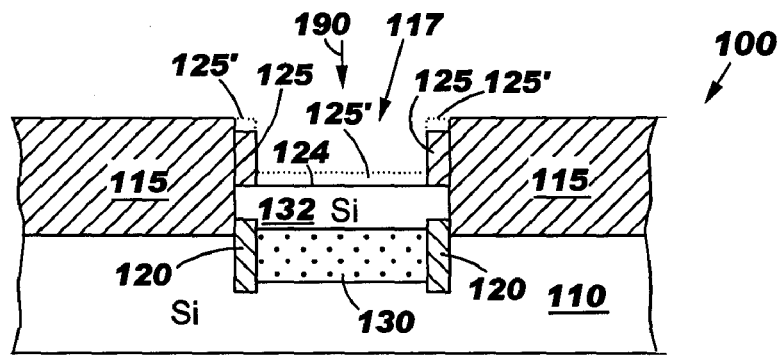

With reference to FIG. 1E, in one embodiment, a gate spacer region 125 is formed on side walls of the trench 117. In one embodiment, the gate spacer region 125 can be similar to the buried barrier region 120 (i.e., having the shape of hollow pipe whose top view has the shape of a ring). The gate spacer region 125 serves to make the gate electrode physically smaller, which allows for lower gate capacitance and thus faster switching characteristics of the completed transistor 100. In one embodiment, the formation of the gate spacer region 125 is similar to the formation of the buried barrier region 120.

More specifically, the formation of the gate spacer region 125 can start with the formation of a gate spacer layer 125' (defined by the dashed line) on side and bottom walls of the trench 117 by, illustratively, CVD $SiO_2$. Then, the gate spacer layer is etched down in vertical direction 190. As a result, the gate spacer region 125 is formed as shown.

After the gate spacer region 125 is formed, in one embodiment, a buried well region 130 surrounded (i.e., circumscribed) by the buried barrier region 120 is doped heavily ($1\times10^{19}$-$1\times10^{20}$ impurity atoms/cm$^3$). In an alternative embodiment, the buried well region 130 is doped before the gate spacer region 125 is formed. The silicon region 132 on top of the buried well region 130 can be referred to as the channel region 132. If the structure 100 is to become an n-channel transistor, the buried well region 130 should be doped heavily with p-type impurities (e.g., Boron, Indium, or Galium). Conversely, if the structure 100 is to become a p-channel transistor, the buried well region 130 should be doped heavily with n-type impurities (e.g., Arsenic, Antimony, or Phosphorous).

Figure 1F:
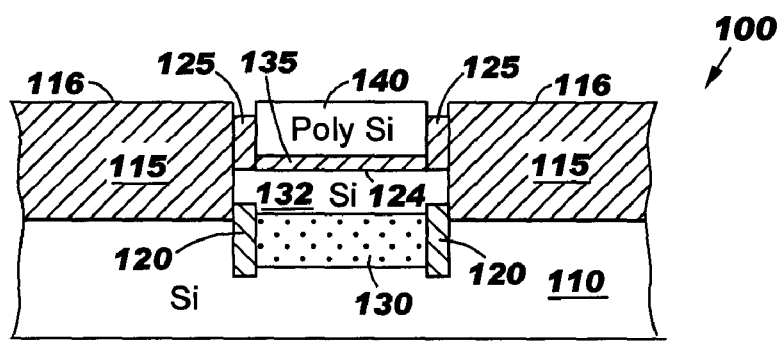

With reference to FIG. 1F, in one embodiment, a gate dielectric layer 135 is formed on top of the surface 124 of the channel region 132. More specifically, in one embodiment, the gate dielectric layer 135 can be formed by thermal oxidation of the top surface 124 of the channel region 132 with the presence of nitrogen. As a result, the resulting gate dielectric layer 135 can comprise silicon dioxide and silicon nitride. Next, a gate region 140 is formed on top of the gate dielectric layer 135. In one embodiment, the gate region 140 can comprise polysilicon which is deposited by, illustratively, CVD on top of the entire structure 100 followed by a planarization step (until a top surface 116 of the mandrel layer 115 is exposed to the atmosphere).

Figure 1G:
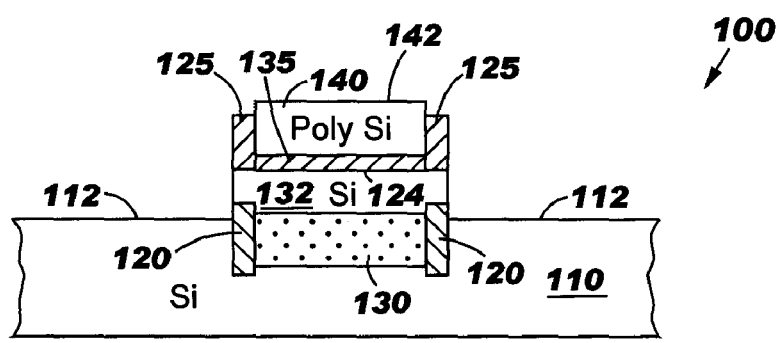

With reference to FIG. 1G, in one embodiment, the mandrel layer 115 is removed by, illustratively, selective etching (i.e., using a chemical etchant that reacts with nitride of the mandrel layer 115, but not with polysilicon or silicon dioxide of the gate region 140 and the gate spacer region 125, respectively). In one embodiment, the chemical etchant can be hot phosphoric acid.

Figure 1H:
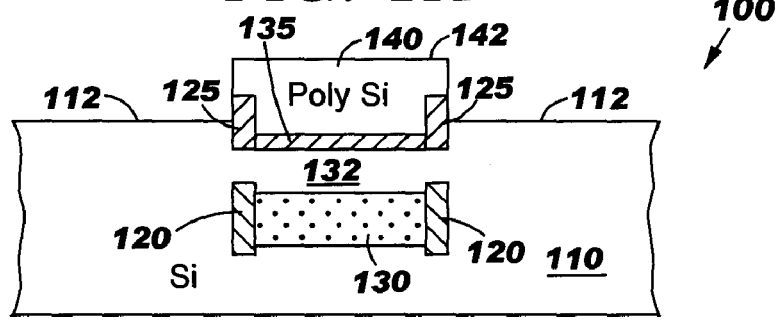

Next, in one embodiment, silicon is selectively grown on top of the regions of exposed silicon on structure 100 until the top surface 112 of the single-crystal silicon substrate 110 rises to a level higher than the gate dielectric layer 135 as shown in FIG. 1H. More specifically, because both the substrate 110 and the channel region 132 comprise single-crystal silicon, single-crystal silicon grows from both the substrate 110 and the channel region 132 and merges as a result of the epitaxial growth so as to cause the surface 112 of the substrate 110 to rise. Also as a result of the epitaxial growth, polysilicon grows from the top surface 142 of the polysilicon gate region 140.

Figure 1I:
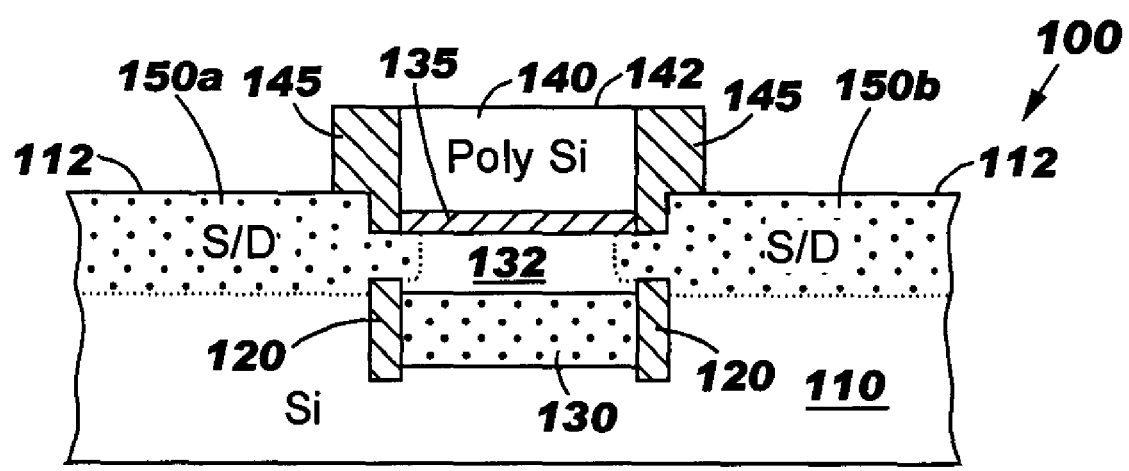

Next, with reference to FIG. 1I, in one embodiment, the gate spacer region 125 is enlarged to become the gate spacer region 145 as shown. More specifically, in one embodiment, the gate spacer region 145 can be formed by conformal deposition (such as CVD) of silicon dioxide. Then, the newly deposited $SiO_2$ is etched back so as to expose to the atmosphere the top surface 112 of the substrate 110 and the top surface 142 of the gate region 140 and leave the gate spacer region 145 on the side walls of the gate region 140.

Next, in one embodiment, heavily-doped ($5\times10^{19}$-$3\times10^{20}$ impurity atoms/cm$^3$) source/drain regions 150a and 150b are formed at top regions of the substrate 110. More specifically, in one embodiment, the source/drain regions 150a and 150b can be doped by ion implantation using the gate spacer region 145 as a mask. This ion implantation step also implants dopants in the polysilicon gate region 140, but that does not detrimentally affect the functionality of the gate region 140. If the structure 100 is to become an n-channel transistor, the source/drain regions 150a and 150b should be heavily doped with n-type impurities (e.g., arsenic, phosphorous, or antimony).

In summary, with the presence of the heavily-doped buried well region 130 under the channel region 132, a specified target threshold voltage of the transistor 100 can be achieved through fabrication within an acceptable tolerance by controlling the electrical voltage of the buried well region 130. In addition, with the presence of the buried barrier region 120 which surrounds the buried well region 130 and therefore insulates the buried well region 130 from the source/drain regions 150a and 150b, the leakage current and junction capacitance between the buried well region 130 and the source/drain region 150a and the leakage current and junction capacitance between the buried well region 130 and the source/drain region 150b are eliminated or at least reduced during the operation of the structure 100. In one embodiment, the material of the buried barrier region 120 can be selected so as to maximize the effect of preventing (i.e., essentially eliminating) such leakage current and junction capacitance.

In the embodiments described above, the substrate 110 can be undoped or lightly doped with p-type impurities if the structure 100 is to become an n-channel device or with n-type impurities if the structure 100 is to become a p-channel device. The substrate 110 can comprise any other semiconductor material instead of and/or in combination with silicon.

In an alternative embodiment, the trench 117 (FIG. 1B) can have the shape of a trench, and accordingly the buried barrier region 120 (FIG. 1C) can comprise two separate regions on two opposite side walls of the trench 117.

FIGS. 2A-2D illustrate cross-sectional views of another semiconductor structure 200 going through different fabrication steps, in accordance with embodiments of the present invention. The fabrication process for the semiconductor structure 200 is similar to that for the semiconductor structure 100 of FIGS. 1A-1I, except that a silicon-on-insulator (SOI) substrate 210 is used in the fabrication process for the semiconductor structure 200.

Figure 2A:
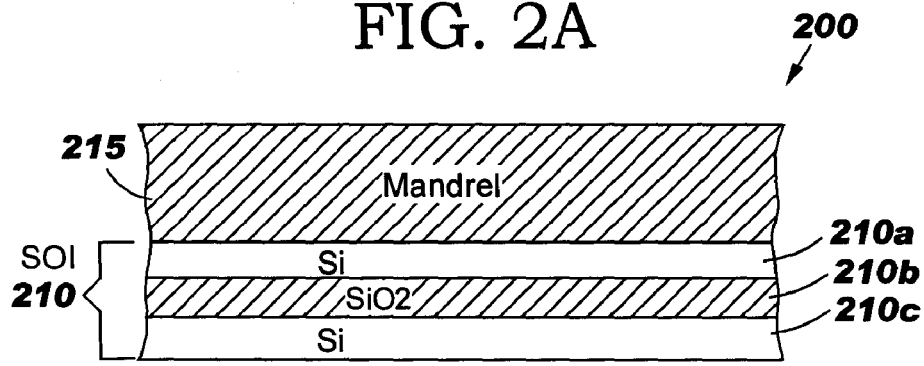
FIGS. 2A-2D illustrate cross-sectional views of another semiconductor structure going through different fabrication steps, in accordance with embodiments of the present invention.
Figure 2B:
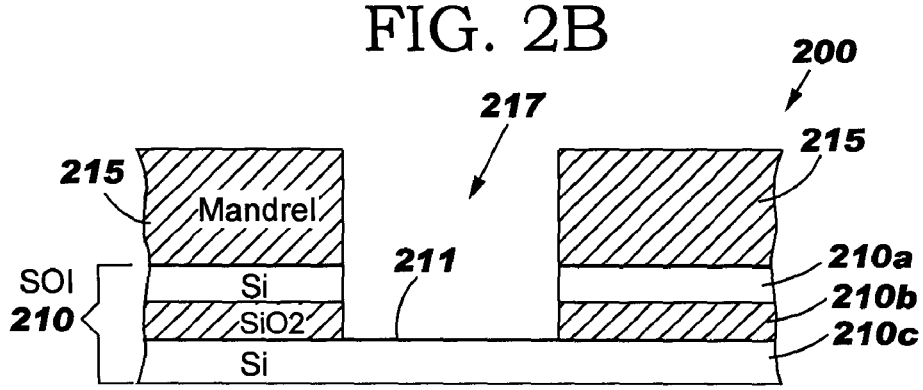
Figure 2C:
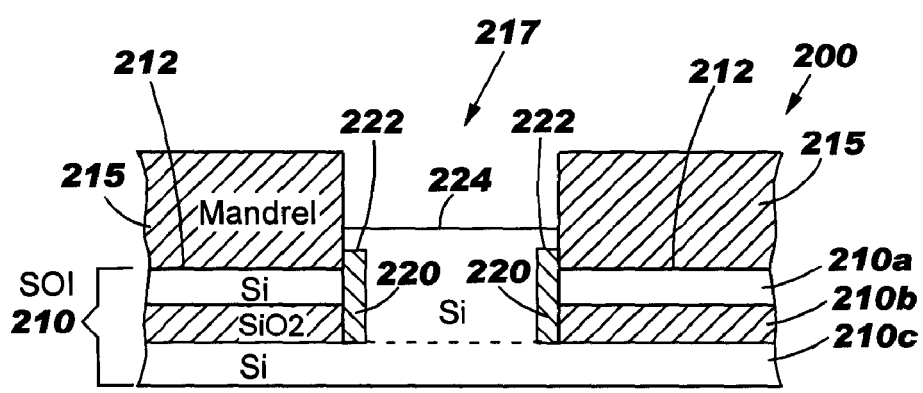

With reference to FIG. 2A, in one embodiment, the fabrication of the semiconductor structure 200 starts out with a silicon-on-insulator (SOI) substrate 210 covered on top with a mandrel layer 215. The SOI substrate 210 can comprise (i) an upper semiconductor layer 210a, (ii) a lower semiconductor layer 210c, and (iii) an electrical insulator layer 210b sandwiched between the upper semiconductor layer 210a and the lower semiconductor layer 210c. In one embodiment, the mandrel layer 215 can comprise a nitride such as silicon nitride ($Si_3N_4$). Then, a trench 217 is etched through the mandrel layer 215 so that the SOI substrate 210 is exposed at the bottom of the trench 217. Next, in one embodiment, the trench 217 is etched deeper into the SOI substrate 210 as shown in FIG. 2B such that a top surface 211 of the lower semiconductor layer 210c is exposed to the atmosphere at a bottom wall 211 of the trench 217.

Afterwards, the fabrication steps for forming the semiconductor structure 200 are similar to the fabrication steps for forming the semiconductor structure 100 of FIGS. 1A-1I. More specifically, with reference to FIG. 2C, in one embodiment, a buried barrier region 220 can be formed on side walls of the trench 217. In one embodiment, the top surface 222 of the buried barrier region 220 is higher than the top surface 212 of the SOI substrate 210. In other words, the buried barrier region 220 is in direct physical contact with both the SOI substrate 210 and the mandrel layer 215.

Then, in one embodiment, silicon material is epitaxially grown in the trench 217 to a top surface 224 which is higher than the top surface 222 of the buried barrier region 220. As a result, the substrate region 210c has a new top surface 224 in the trench 217, and the buried barrier region 220 is completely submerged (i.e., buried) in the substrate region 210c.

Figure 2D:
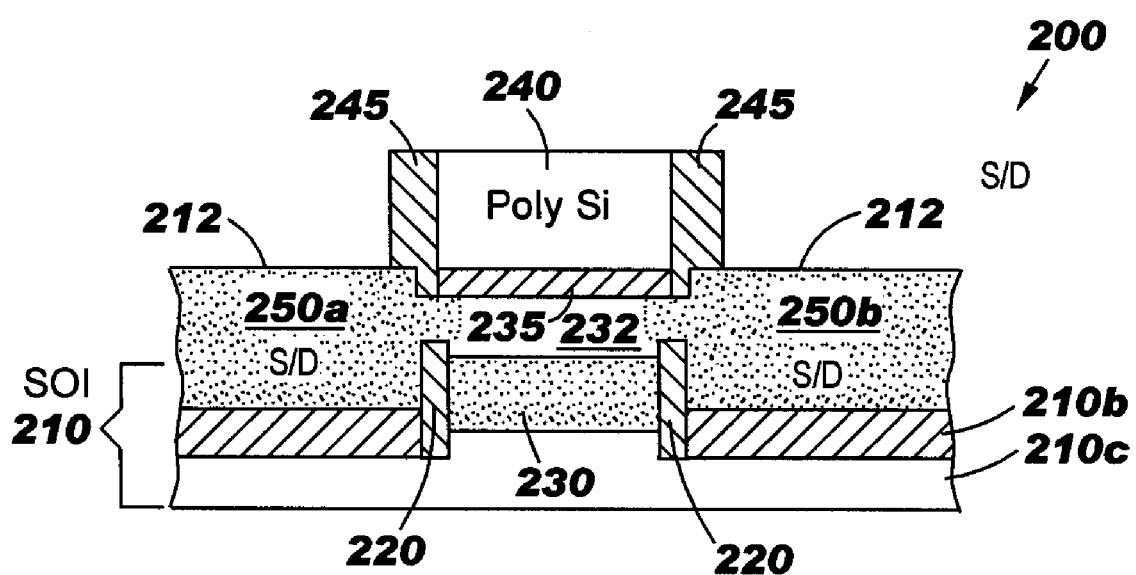

The remaining steps of the fabrication process of the semiconductor structure 200 is similar to that of the semiconductor structure 100 of FIGS. 1A-1I. As a result, the final structure 200 of FIG. 2D is similar to the structure 100 of FIG. 1I, except that the structure 200 has the underlying insulator layer 210b. More specifically, the semiconductor structure 200 comprises a gate region 240, a gate dielectric layer 235, gate spacer regions 245, source/drain regions 250a and 250b, a channel region 232, a buried well region 230, a buried barrier region 220, the underlying insulator layer 210c, and the lower semiconductor layer 210c.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
   a semiconductor layer;
   first and second source/drain regions on the semiconductor layer, wherein the first and second source/drain regions each comprise dopants of a first doping polarity;
   a semiconductor channel region disposed between the first and second source/drain regions;
   a semiconductor buried well region in direct physical contact with the semiconductor channel region,
      wherein the semiconductor buried well region comprises dopants of a second doping polarity opposite to the first doping polarity,
      wherein said dopants of the second doping polarity of the semiconductor buried well region have a doping concentration higher than that of the semiconductor layer, and
      wherein the semiconductor buried well region is on and in direct physical contact with the semiconductor layer; and
   a buried barrier region being disposed between the semiconductor buried well region and the first source/drain region and being disposed between the semiconductor buried well region and the second source/drain region,
   wherein the buried barrier region is adapted for preventing leakage current between the semiconductor buried well region and the first source/drain region and between the semiconductor buried well region and the second source/drain region.

2. The semiconductor structure of claim 1, further comprising:
   a gate region; and
   a gate dielectric layer disposed between and electrically insulating the gate region and the semiconductor channel region from each other,
   wherein the semiconductor channel region is sandwiched between the gate dielectric layer and the semiconductor buried well region.

3. The semiconductor structure of claim 2, wherein the gate region comprises polysilicon.

4. The semiconductor structure of claim 2,
   wherein the semiconductor channel region and the gate dielectric layer are in direct physical contact with each other via a common interfacing surface that defines a plane, and
   wherein said defined plane divides the first source/drain region into two regions.

5. The semiconductor structure of claim 4,
   wherein said defined plane divides the second source/drain region into two regions.

6. The semiconductor structure of claim 1, further comprising an underlying dielectric layer, wherein the first and second source/drain regions are on top of and in direct physical contact with the underlying dielectric layer.

* * * * *